(12) United States Patent
Khesbak et al.

(10) Patent No.: US 9,331,653 B2
(45) Date of Patent: May 3, 2016

(54) APPARATUS AND METHODS FOR ENVELOPE SHAPING IN POWER AMPLIFIER SYSTEMS

(71) Applicant: SKYWORKS SOLUTIONS, INC., Woburn, MA (US)

(72) Inventors: Sabah Khesbak, Irvine, CA (US); Cyrille Rio, Irvine, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 85 days.

(21) Appl. No.: 14/257,575

(22) Filed: Apr. 21, 2014

(65) Prior Publication Data

US 2014/0312974 A1  Oct. 23, 2014

Related U.S. Application Data

(60) Provisional application No. 61/815,140, filed on Apr. 23, 2013.

(51) Int. Cl.
*H01Q 11/12* (2006.01)
*H04B 1/04* (2006.01)
(Continued)

(52) U.S. Cl.
CPC ........... *H03G 3/3042* (2013.01); *H03F 1/0227* (2013.01); *H03F 3/19* (2013.01); *H03F 3/245* (2013.01); *H03G 3/004* (2013.01); *H03F 2200/102* (2013.01); *H03F 2200/451* (2013.01)

(58) Field of Classification Search
CPC .............................................. H04B 2001/0416
USPC ............... 455/78, 83, 102, 115.1, 115.2, 126, 455/127.1, 127.2, 114.3, 127.5
See application file for complete search history.

(56) References Cited

U.S. PATENT DOCUMENTS 5,264,752 A   11/1993   Savicki
7,482,869 B2   1/2009   Wilson
(Continued)

FOREIGN PATENT DOCUMENTS

GB   2398648   8/2004
GB   2409115   11/2006
(Continued)

OTHER PUBLICATIONS

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.
(Continued)

*Primary Examiner* — Nguyen Vo
(74) *Attorney, Agent, or Firm* — Knobbe Martens Olson & Bear LLP (57) ABSTRACT

Apparatus and methods for envelope shaping in power amplifier systems are provided. In certain implementations, a power amplifier system includes a modulator for generating a RF signal, a power amplifier for amplifying the RF signal, a gain control circuit for controlling the gain of the power amplifier, and an envelope tracking system for controlling a voltage level of the power amplifier's supply voltage based on an envelope signal corresponding to the RF signal's envelope. The gain control circuit includes a gain adjustment table, and the envelope tracking system includes an envelope shaping circuit including an isodistortion table. The isodistortion table can be used to map the envelope signal to a shaped envelope signal so as to maintain a substantially constant distortion in the system's transmit and/or receive bands across the envelope signal's range.

20 Claims, 5 Drawing Sheets

(51) Int. Cl.
*H03G 3/30* (2006.01)
*H03G 3/00* (2006.01)
*H03F 3/24* (2006.01)
*H03F 3/19* (2006.01)
*H03F 1/02* (2006.01)

(56) References Cited

U.S. PATENT DOCUMENTS

| | | | |
|---|---|---|---|
| 2002/0030543 | A1 | 3/2002 | French et al. |
| 2002/0146993 | A1* | 10/2002 | Persico ................ H03F 1/0261 455/126 |
| 2003/0155978 | A1 | 8/2003 | Pehlke |
| 2007/0210771 | A1 | 9/2007 | Wilson et al. |
| 2007/0249304 | A1 | 10/2007 | Snelgrove et al. |
| 2007/0273449 | A1 | 11/2007 | Wilson |
| 2007/0279019 | A1 | 12/2007 | Wilson |
| 2009/0128236 | A1 | 5/2009 | Wilson |
| 2009/0289720 | A1 | 11/2009 | Takinami et al. |
| 2009/0302941 | A1 | 12/2009 | Wimpenny |
| 2011/0058601 | A1* | 3/2011 | Kim .................... H04L 27/366 375/238 |
| 2012/0200354 | A1* | 8/2012 | Ripley ................ H03F 1/0227 330/131 |
| 2015/0088445 | A1* | 3/2015 | Wills .................... H03F 1/0222 702/66 |

FOREIGN PATENT DOCUMENTS

| | | |
|---|---|---|
| GB | 2426392 | 5/2007 |
| GB | 2411062 | 11/2007 |
| WO | WO 2009/106628 | 9/2009 |
| WO | WO 2009/106631 | 9/2009 |
| WO | WO 2009/106632 | 9/2009 |
| WO | WO 2009/127739 | 10/2009 |
| WO | WO 2009/135941 | 11/2009 |
| WO | WO 2009/138505 | 11/2009 |
| WO | WO 2009/141413 | 11/2009 |

OTHER PUBLICATIONS

Huang et al. "A MASH Controlled Multilevel Power Converter for High-Efficiency RF Transmitters," IEEE Transactions on Power Electronics, vol. 26, No. 4, Apr. 2011, pp. 1205-1214.

Kaneta et al. "Architecture of Wideband High-Efficiency Envelope Tracking Power Amplifier for Base Station," IEICE Technical Report, Osaka, 2009.

Kang et al. "A Multimode/Multiband Power Amplifier With a Boosted Supply Modulator," IEEE Transactions on Microwave Theory and Techniques, vol. 58, No. 10, Oct. 2010, pp. 2598-2608.

Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.

Wimpenny, "Understand and characterize envelope-tracking power amplifiers," May 2012, 9 pages (available at World Wide Web page: edn.com/design/analog/4372705/Understand-and-characterize-envelope-tracking-power-amplifiers-item-2).

Wu et al. "A Two-Phase Switching Hybrid Supply Modulator for Polar Transmitters with 9% Efficiency Improvement," IEEE International Solid-State Circuits Conference, Feb. 2010, pp. 196-198.

Yousefzadeh et al. "Three-Level Buck Converter for Envelope Tracking Applications," IEEE Transactions on Power Electronics, vol. 21, No. 2, Mar. 2006, pp. 549-552.

* cited by examiner

APPARATUS AND METHODS FOR ENVELOPE SHAPING IN POWER AMPLIFIER SYSTEMS

CROSS-REFERENCE TO RELATED APPLICATIONS

This application claims the benefit of priority under 35 U.S.C. §119(e) of U.S. Provisional Patent Application No. 61/815,140, filed Apr. 23, 2013 entitled "APPARATUS AND METHODS FOR ENVELOPE SHAPING IN POWER AMPLIFIER SYSTEMS", which is herein incorporated by reference in its entirety.

BACKGROUND

1. Field

Embodiments of the invention relate to electronic systems, and in particular, to power amplifiers for radio frequency (RF) electronics.

2. Description of the Related Technology

Power amplifiers can be included in mobile devices to amplify a RF signal for transmission via an antenna. For example, in mobile devices having a time division multiple access (TDMA) architecture, such as those found in Global System for Mobile Communications (GSM), code division multiple access (CDMA), and wideband code division multiple access (W-CDMA) systems, a power amplifier can be used to amplify a RF signal having a relatively low power. It can be important to manage the amplification of a RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot.

The power consumption of a power amplifier can be an important consideration. One technique for reducing power consumption of a power amplifier is envelope tracking, in which the voltage level of the power supply of the power amplifier is controlled in relation to the envelope of the RF signal. Thus, when the envelope of the RF signal increases, the voltage supplied to the power amplifier can be increased. Likewise, when the envelope of the RF signal decreases, the voltage supplied to the power amplifier can be decreased to reduce power consumption.

SUMMARY

In certain embodiments, the present disclosure relates to a power amplifier system. The power amplifier system includes a modulator configured to generate a radio frequency (RF) signal and a power amplifier configured to amplify the RF signal to generate an amplified RF signal. The power amplifier is configured to receive a power amplifier supply voltage for powering the power amplifier. The power amplifier system further includes an envelope tracker configured to generate the power amplifier supply voltage, and to control a voltage level of the power amplifier supply voltage based on a shaped envelope signal. The power amplifier system further includes an envelope shaping circuit configured to generate the shaped envelope signal by shaping an envelope signal corresponding to an envelope of the RF signal. The envelope shaping circuit includes a shaping table configured to maintain a substantially constant distortion in at least one of a transmit band or a receive band across voltage changes in the envelope signal. The shaping table is calibrated at a first power level. The power amplifier system further includes a gain control circuit including a gain adjustment table configured to boost the gain of the power amplifier for one or more output power levels greater than the first power level. The gain control circuit is configured to enhance a combined power efficiency of the modulator and the power amplifier.

In various embodiments, the shaping table is further configured to maintain a substantially constant distortion in both the transmit band and the receive band across voltage changes in the envelope signal.

In a number of embodiments, the gain adjustment table is further configured to decrease the gain of the power amplifier for one or more output power levels less than the first power level.

According to certain embodiments, the shaping table is configured to maintain a distortion of the power amplifier system to be less than about −38 dBc for the transmit band and less than about −130 dBm/Hz for the receive band.

In some embodiments, the shaping table includes a look-up table configured to receive a digital input signal and to generate a digital output signal. The digital input signal indicates a voltage level of the envelope signal, and the digital output signal indicates a voltage level of the shaped envelope signal. In accordance with some embodiments, the power amplifier system further includes a digital-to-analog converter (DAC) configured to convert the digital output of the shaping table to generate the shaped envelope signal.

In various embodiments, the gain adjustment table includes a look-up table configured to receive a digital input signal and to generate a digital output signal. The digital input signal indicates a voltage level of a power feedback signal, and the digital output signal indicates a voltage level of a power amplifier bias signal. In some embodiments power amplifier system further includes a DAC configured to convert the digital output of the gain adjustment table to generate an analog bias control signal. In certain embodiments, the power amplifier system further includes a power amplifier bias circuit configured to control the gain of the power amplifier using the analog bias control signal. In some embodiments, the power amplifier includes a bipolar transistor, and the power amplifier bias circuit is configured to control at least one of a base bias current or a base bias voltage of the bipolar transistor. In certain embodiments, the power amplifier system further includes a directional coupler configured to sense a power output level of the power amplifier, and the power feedback signal is based on the power output level sensed by the directional coupler.

In certain embodiments, the present disclosure relates to a mobile device. The mobile device includes a baseband processor configured to generate an in-phase (I) signal, a quadrature-phase (Q) signal, and an envelope signal indicative of an envelope of the I signal and the Q signal. The mobile device further includes an I/Q modulator configured to receive the I signal and the Q signal and to generate an RF signal. The mobile device further includes a power amplifier configured to amplify the RF signal to generate an amplified RF signal, and the power amplifier is configured to receive a power amplifier supply voltage for powering the power amplifier. The mobile device further includes an envelope shaping circuit configured to generate a shaped envelope signal by shaping the envelope signal. The envelope shaping circuit includes a shaping table configured to maintain a substantially constant distortion in at least one of a transmit band or a receive band across voltage changes in the envelope signal, and the shaping table is calibrated at a first power level. The mobile device further includes an envelope tracker configured to generate the power amplifier supply voltage, the envelope tracker configured to control a voltage level of the power amplifier supply voltage based on a shaped envelope signal, and a gain control circuit including a gain adjustment table configured to boost the gain of the power amplifier for one or more output power levels greater than the first power level.

In various embodiments, the shaping table is further configured to maintain a substantially constant distortion in both the transmit band and the receive band across voltage changes in the envelope signal.

In certain embodiments, the mobile device further includes a battery configured to provide a battery voltage to the envelope tracker.

In accordance with some embodiments, the mobile device further includes a switch configured to receive the amplified RF signal from the power amplifier and an antenna electrically connected to the switch.

In various embodiments, the gain adjustment table includes a look-up table configured to receive a digital input signal and to generate a digital output signal. The digital input signal indicates a voltage level of a power feedback signal, and the digital output signal indicates a voltage level of a power amplifier bias signal. In certain embodiments, the mobile device further includes a directional coupler configured to sense a power output level of the power amplifier, the power feedback signal based on the power output level sensed by the directional coupler.

In certain embodiments, the present disclosure relates to a method of amplification in a power amplifier system. The method includes generating an RF signal using a modulator, amplifying the RF signal to generate an amplified RF signal using a power amplifier, and generating a shaped envelope signal by shaping an envelope signal corresponding to an envelope of the RF signal using an envelope shaping circuit. The envelope shaping circuit includes a shaping table for mapping a plurality of voltage levels of the envelope signal to a plurality of voltage levels of the shaped envelope signal by maintaining a substantially constant distortion in at least one of a transmit band or a receive band across voltage changes in the envelope signal. The shaping table is calibrated at a first power level. The method further includes generating a power amplifier supply voltage for the power amplifier using an envelope tracker, controlling a voltage level of the power amplifier supply voltage based on the shaped envelope signal using the envelope tracker, and controlling the gain of the power amplifier using a gain control circuit. The gain control circuit includes a gain adjustment table for boosting a gain of the power amplifier for one or more output power levels greater than the first power level to enhance a combined power efficiency of the modulator and the power amplifier.

In various embodiments, the method further includes using the shaping table to maintain a distortion of the power amplifier system to be less than about −38 dBc for the transmit band and less than about −130 dBm/Hz for the receive band.

In accordance with certain embodiments, controlling the gain of the power amplifier further includes using the gain adjustment table to decrease the gain of the power amplifier for one or more output power levels less than the first power level.

DETAILED DESCRIPTION OF EMBODIMENTS

The headings provided herein, if any, are for convenience only and do not necessarily affect the scope or meaning of the claimed invention.

Figure 1:
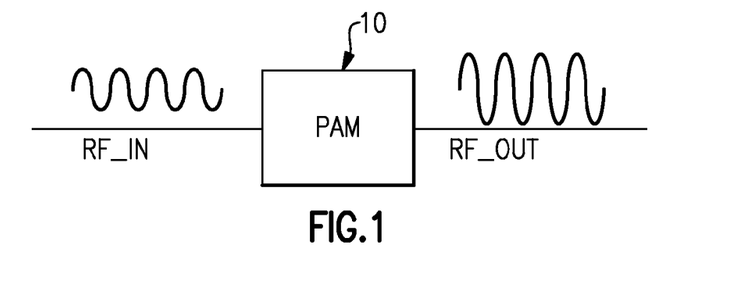
FIG. 1 is a schematic diagram of a power amplifier module for amplifying a radio frequency (RF) signal.

FIG. 1 is a schematic diagram of a power amplifier module 10 for amplifying a radio frequency (RF) signal. The illustrated power amplifier module 10 can be configured to amplify a RF signal RF_IN to generate an amplified RF signal RF_OUT. As described herein, the power amplifier module 10 can include one or more power amplifiers.

Figure 2:
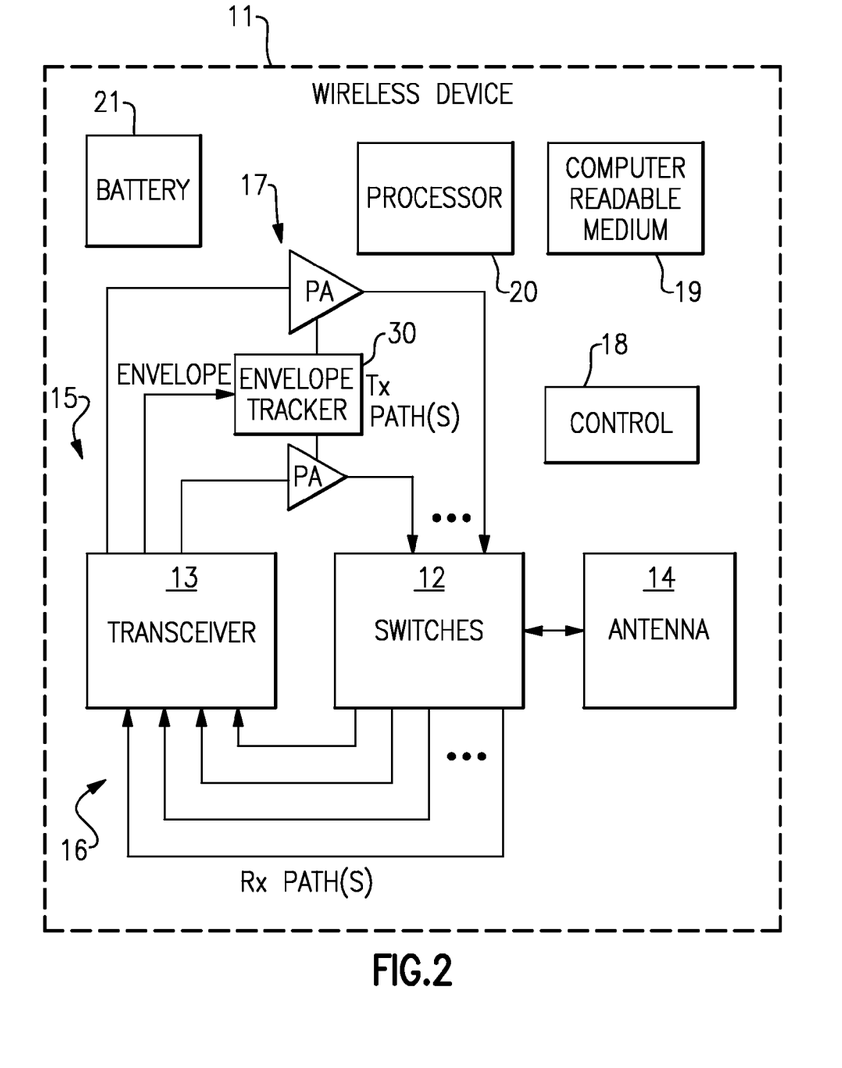
FIG. 2 is a schematic block diagram of an example wireless device that can include one or more of the power amplifier modules of FIG. 1.

FIG. 2 is a schematic block diagram of an example wireless device 11 that can include one or more of the power amplifier modules 10 of FIG. 1. The wireless device 11 can include power amplifiers implementing one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

One or more features of the present disclosure can be implemented in the foregoing example modes and/or bands, and in other communication standards. For example, 3G and 4G are non-limiting examples of such standards.

In certain embodiments, the wireless device 11 can include switches 12, a transceiver 13, an antenna 14, power amplifiers 17, a control component 18, a computer readable medium 19, a processor 20, a battery 21, and an envelope tracker 30.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates the wireless device 11 as including two transmission paths 15, the wireless device 11 can be adapted to include more or fewer transmission paths 15.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although FIG. 2 illustrates the wireless device 11 as including four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17, the envelope tracker 30, and/or other operating components.

In certain embodiments, a processor 20 can be configured to facilitate implementation of various processes described herein. In certain implementations, the processor 20 can operate using computer program instructions. In certain embodiments, these computer program instructions may also be stored in a computer-readable memory 19 that can direct a computer or other programmable data processing apparatus to operate in a particular manner.

The illustrated wireless device 11 also includes the envelope tracker 30, which can be used to provide a power amplifier supply voltage to one or more of the power amplifiers 17. For example, the envelope tracker 30 can control or vary the voltage level of the power amplifier supply voltage provided to the power amplifiers 17 based upon an envelope of the RF signal to be amplified.

Although not illustrated in FIG. 2, the envelope tracker 30 can receive a battery voltage from the battery 21. The battery 21 can be any suitable battery for use in the wireless device 11, including, for example, a lithium-ion battery. As will be described in detail further below, by controlling the voltage level of the power amplifier supply voltage provided to the power amplifiers using the envelope tracker 30, the power consumed from the battery 21 can be reduced, thereby improving performance of the battery life of the wireless device 11. In certain implementations, the envelope tracker 30 can receive the envelope signal from the transceiver 13. However, the envelope of the RF signal can be determined in other ways, such as by detecting the RF signal's envelope using any suitable envelope detector.

Figure 3:
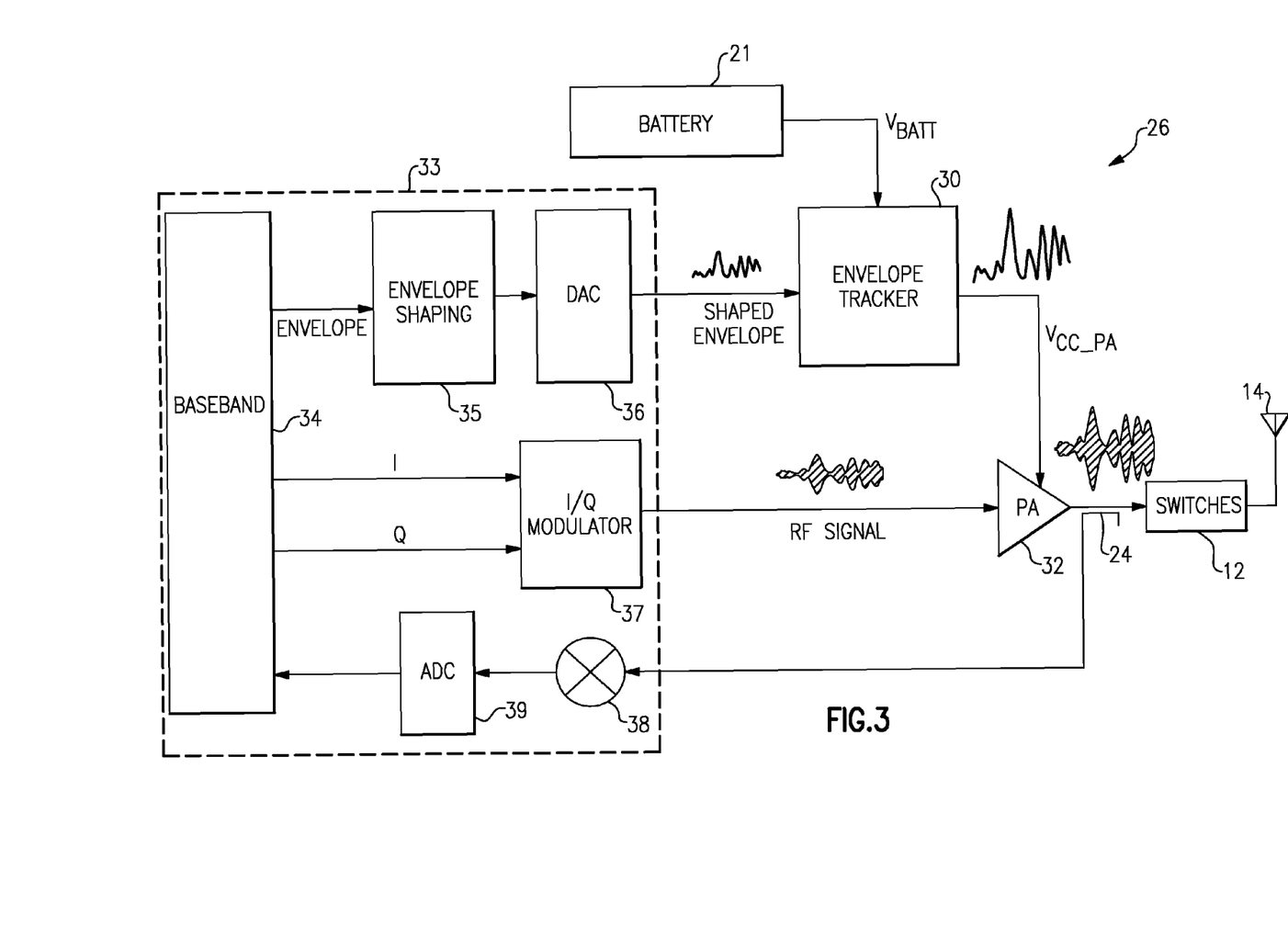
FIG. 3 is a schematic block diagram of one example of a power amplifier system including an envelope tracking system.

FIG. 3 is a schematic block diagram of one example of a power amplifier system 26 including an envelope tracking system. The illustrated power amplifier system 26 includes the switches 12, the antenna 14, the battery 21, a directional coupler 24, the envelope tracker 30, a power amplifier 32, and a transceiver 33. The illustrated transceiver 33 includes a baseband processor 34, an envelope shaping block or circuit 35, a digital-to-analog converter (DAC) 36, an I/Q modulator 37, a mixer 38, and an analog-to-digital converter (ADC) 39.

The baseband processor 34 can be used to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can be configured to receive the I and Q signals from the baseband processor 34 and to process the I and Q signals to generate an RF signal. For example, the I/Q modulator 37 can include DACs configured to convert the I and Q signals into an analog format, mixers for upconverting the I and Q signals to radio frequency, and a signal combiner for combining the upconverted I and Q signals into an RF signal suitable for amplification by the power amplifier 32. In certain implementations, the I/Q modulator 37 can include one or more filters configured to filter frequency content of signals processed therein.

The envelope shaping block 35 can be used to convert an envelope or amplitude signal associated with the I and Q signals into a shaped envelope signal. Shaping the envelope signal from the baseband processor 34 can aid in enhancing performance of the power amplifier system 26. In certain implementations, the envelope shaping block 35 is a digital circuit configured to generate a digital shaped envelope signal, and the DAC 36 is used to convert the digital shaped envelope signal into an analog shaped envelope signal suitable for use by the envelope tracker 30. However, in other implementations, the DAC 36 can be omitted in favor of providing the envelope tracker 30 with a digital envelope signal to aid the envelope tracker 30 in further processing of the envelope signal.

The envelope tracker 30 can receive the envelope signal from the transceiver 33 and a battery voltage $V_{BATT}$ from the battery 21, and can use the envelope signal to generate a power amplifier supply voltage $V_{CC\_PA}$ for the power amplifier 32 that changes in relation to the envelope. The power amplifier 32 can receive the RF signal from the I/Q modulator 37 of the transceiver 33, and can provide an amplified RF signal to the antenna 14 through the switches 12.

The directional coupler 24 can be positioned between the output of the power amplifier 32 and the input of the switches 12, thereby allowing an output power measurement of the power amplifier 32 that does not include insertion loss of the switches 12. The sensed output signal from the directional coupler 24 can be provided to the mixer 38, which can multiply the sensed output signal by a reference signal of a controlled frequency (not illustrated in FIG. 3) so as to downshift the frequency spectrum of the sensed output signal. The downshifted signal can be provided to the ADC 39, which can convert the downshifted signal to a digital format suitable for processing by the baseband processor 34. By including a feedback path between the output of the power amplifier 32 and an input of the baseband processor 34, the baseband processor 34 can be configured to dynamically adjust the I and Q signals and/or envelope signal associated with the I and Q signals to optimize the operation of the power amplifier system 26. For example, configuring the power amplifier system 26 in this manner can aid in controlling the power added efficiency (PAE) and/or linearity of the power amplifier 32.

Although the power amplifier system 26 is illustrated as include a single power amplifier, the teachings herein are applicable to power amplifier systems including multiple power amplifiers, including, for example, multi-mode and/or multi-mode power amplifier systems.

Additionally, although FIG. 2 illustrates a particular configuration of a transceiver, other configurations are possible, including for example, configurations in which the transceiver 33 includes more or fewer components and/or a different arrangement of components.

Overview of Power Amplifier Systems Including an Isodistortion Table and a Gain Adjustment Table Power added efficiency (PAE) is one metric for rating a power amplifier and can correspond to the ratio of the difference between the output and input signal power to the DC power consumed by the power amplifier. Additionally, linearity can be another metric for rating a power amplifier. PAE and linearity can be metrics by which customers determine which power amplifiers to purchase, as PAE can impact battery life of a mobile device and linearity can impact signal quality of the mobile device and/or compliance with a particular communications standard. Although high PAE and high linearity are both desirable, improving linearity can come at the cost of reducing PAE, while increasing PAE can degrade linearity.

Envelope tracking is a technique that can be used to increase PAE of a power amplifier system by efficiently controlling a voltage level of a power amplifier supply voltage over time. To maintain linearity across changes in power amplifier supply voltage, a conventional envelope tracking system can use an isogain table, which maps or converts an envelope signal to a shaped envelope signal so as to maintain a substantially constant gain across an envelope signal range. Configuring an envelope tracking system in this manner can provide very high linearity over the range of the signal's envelope, thereby helping to ensure that the power amplifier is compliant with a particular communications standard.

Provided herein are apparatus and methods for power amplifier systems. In certain implementations, a power amplifier system includes an I/Q modulator for generating a RF signal, a power amplifier for amplifying the RF signal, a gain control circuit for controlling the gain of the power amplifier, and an envelope tracking system for controlling a voltage level of the power amplifier's supply voltage based on an envelope signal corresponding to the RF signal's envelope. The gain control circuit includes a gain adjustment table, and the envelope tracking system includes an envelope shaping circuit including an isodistortion table. The isodistortion table can be used to map the envelope signal to a shaped envelope signal so as to maintain a substantially constant distortion in the system's transmit and/or receive bands across the envelope signal's range. For example, in certain communications standards, such as long term evolution (LTE), the bandwidth of the transmit signal can be relatively wide, which can result in the power amplifier system generating distortion in both transmit and receive bands. Accordingly, in certain implementations, an isodistortion table is calibrated based on transmit distortion and/or receive distortion.

The isodistortion table can be calibrated at a particular power level, and can shape an envelope signal to achieve a particular distortion level in the transmit and/or receive bands, such as a distortion level less than a maximum distortion permitted by a particular communications standard. For example, a typical cellular communications standard such as 3GPP permits a certain level or amount of distortion, and the isodistortion table can provide a substantially constant distortion across envelope signal values to advantageously increase power efficiency at back-off power levels. Additionally, the gain adjustment table of the gain control circuit can be used to boost the power amplifier's gain at high power levels above a calibration power level of the isodistortion table and, in some implementations, with lower or decreased gain at low power levels below the isodistortion table's calibration power level. As will be described in detail further below, configuring the gain adjustment table in this manner relaxes the operational constraints on the I/Q modulator and improves overall system PAE.

Accordingly, the teachings herein can use a combination of an isodistortion table in the transmit and/or receive bands and a gain adjustment table to enhance overall PAE, thereby optimizing performance relative to configurations using isogain table or configurations that attempt to achieve maximum PAE by optimizing a power amplifier in isolation without consideration of the operation of the overall power amplifier system.

Figure 4:
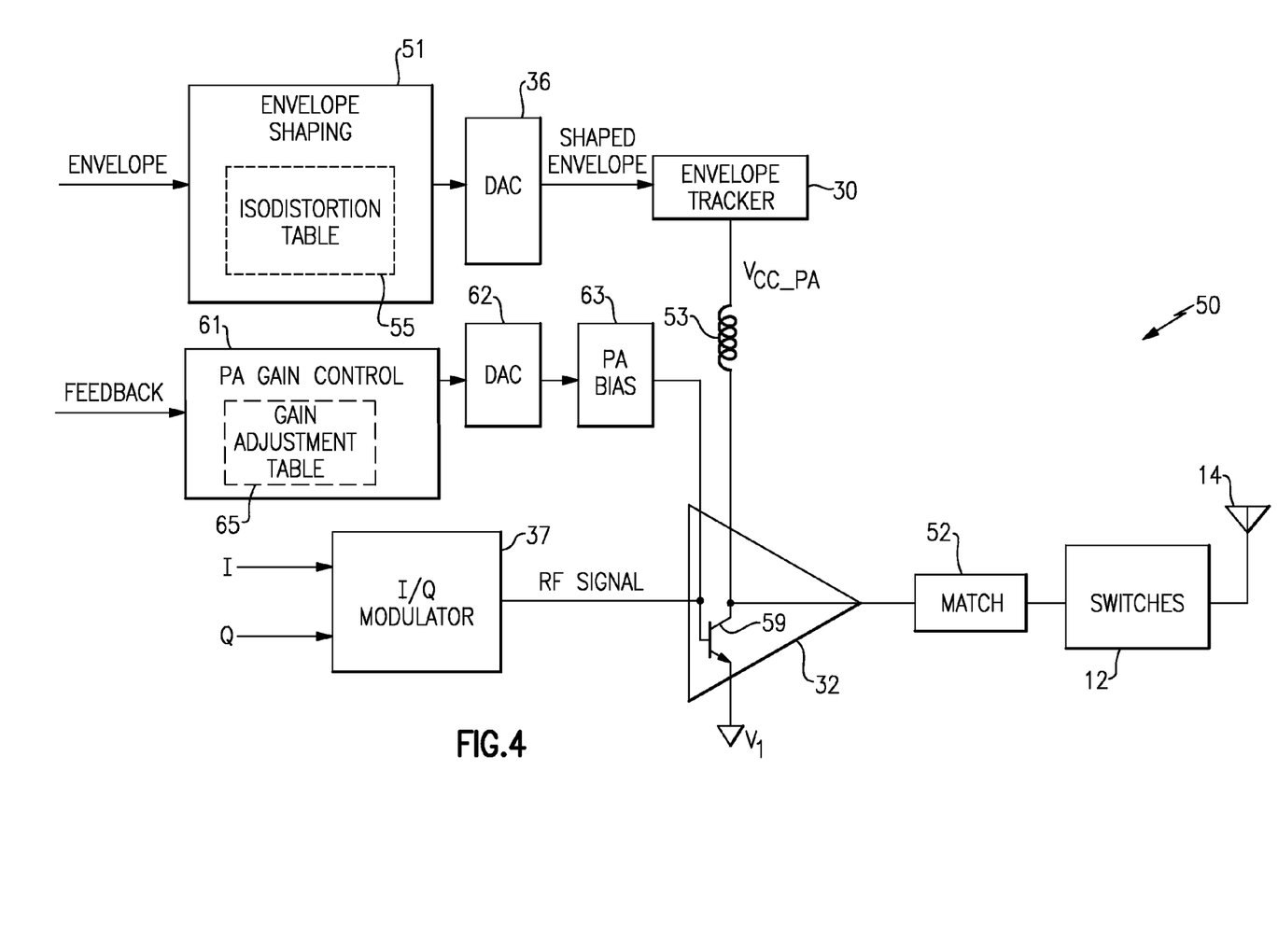
FIG. 4 is a circuit diagram of one embodiment of a power amplifier system.

FIG. 4 is a circuit diagram of one embodiment of a power amplifier system 50. The power amplifier system 50 includes the switches 12, the antenna 14, the envelope tracker 30, the power amplifier 32, the I/Q modulator 37, an envelope shaping circuit 51, a matching circuit 52, an inductor 53, first and second DACs 36, 62, a power amplifier gain control circuit 61, and a power amplifier bias circuit 63.

The envelope shaping circuit 51 includes an isodistortion table 55 and the power amplifier gain control circuit includes a gain adjustment table 65. The envelope shaping circuit 51, the first DAC 36, and the envelope tracker 30 are associated with an envelope tracking system of the power amplifier system 50. The power amplifier gain control circuit 61, the second DAC 62, and the power amplifier bias circuit 63 are associated with a gain control system of the power amplifier system 50.

The envelope shaping circuit 51 is configured to receive an envelope signal, and to shape the envelope signal using the isodistortion table 55 to generate a shaped envelope signal, which can be used by the envelope tracker 30 to control a voltage level of the power amplifier supply voltage $V_{CC\_PA}$. In certain implementations, the shaped envelope signal generated by the envelope shaping circuit 51 can be a digital signal. In such configurations, the first DAC 36 can be used to convert the digital shaped envelope signal into an analog shaped envelope signal, which the envelope tracker 30 can use to control the voltage level of the power amplifier supply voltage $V_{CC\_PA}$. In one embodiment, the isodistortion table 55 is implemented as a look-up table, such as a programmable memory. For example, the look-up table can receive a digital input signal indicating a voltage level of the envelope signal, and can generate a digital output signal indicating a voltage level of the shaped envelope signal.

The power amplifier gain control circuit 61 includes an input configured to receive a power feedback signal and an output configured to generate a power control signal for the power amplifier bias circuit 63 based on the gain adjustment table 65. In certain implementations, the shaped power control signal generated by the power amplifier gain control circuit 61 can be a digital signal. In such configurations, the second DAC 62 can be used to convert the digital gain control signal into an analog gain control signal, which can be used by the power amplifier bias circuit 63 to generate a bias signal that can control the power amplifier's gain.

Thus, the gain adjustment table 65 can be used to map a power feedback signal to a given power amplifier bias level, thereby controlling the power amplifier's gain. In certain implementations, the feedback signal is based in part on a sensed power of a direction coupler, such as the directional coupler 24 of FIG. 3. At high power levels, the gain adjustment table 65 can increase the gain of the power amplifier 32, thereby relaxing a current/power requirement of the I/Q modulator 37. Additionally, in certain implementations, as the output power is decreased or backed-off the gain adjustment table 65 can reduce or buck the power amplifier's gain, thereby improving the efficiency of the amplifier.

In one embodiment, the gain adjustment table 65 is implemented as a look-up table, such as a programmable memory. For example, the look-up table can receive a digital input signal indicating a voltage level of a power feedback signal and can generate a digital output signal indicating a voltage level of a bias signal.

The I/Q modulator 37 is configured to receive an I signal and a Q signal and to generate a RF signal. Additional details of the I/Q modulator 37 can be as described earlier.

The power amplifier 32 includes a bipolar transistor 59, which includes a base configured to receive the RF signal and a bias signal from the power amplifier bias circuit 63. In certain implementations, the bias signal can correspond to a base bias voltage and/or a base bias current. The bipolar transistor 59 further includes an emitter electrically connected to a ground or power low supply, and a collector configured to provide an amplified RF signal to the antenna 14 through the switches 12. The collector of the bipolar transistor 59 is also connected to the inductor 53, which is used to provide the power amplifier 32 with the power amplifier supply voltage $V_{CC\_PA}$ generated by the envelope tracker 30. The inductor 53 can be used to provide a low impedance to low frequency signal components, while choking or blocking high frequency signal components associated with the amplified RF signal.

The matching circuit 52 can be used to terminate the electrical connection between output of the power amplifier 32 and the switches 12. The matching circuit 52 can be used to provide a desired load line impedance of the power amplifier 32 at the fundamental frequency of the RF signal. In certain implementations, the matching circuit 52 can also be used to provide harmonic terminations, including, for example, a second harmonic short and/or a third harmonic open.

Conventional envelope tracking systems can maintain linearity of a power amplifier by using a shaping table that can pre-distort the instantaneous gain of the power amplifier (AM/AM) to a substantially constant gain value or isogain. By implementing the envelope tracking system using an isogain table, the power amplifier can be linearized and distortion can be controlled to about the minimum value possible.

The power amplifier system 50 of FIG. 4 has been implemented based on a recognition that instantaneous isogain is not a requirement of a typical communications standard and that some distortion can be permitted to improve PAE. For example, the isodistortion table 55 can reduce current consumption by controlling the power amplifier's supply voltage to a level sufficient to just provide the required linearity and receive distortion, thereby providing enhanced PAE at low input power levels. Although the isodistortion table 55 can distort the RF signal, the distortion provided can be selected to be less than a maximum distortion permitted by a particular communications standard. Since there is a tradeoff between distortion and linearity, the isodistortion table 55 can increase distortion but enhance PAE.

In certain implementations, the isodistortion table 55 is used to map or convert data indicating the voltage of the envelope signal into data indicating the voltage of the shaped envelope signal to maintain substantially constant distortion. The isodistortion table 55 can maintain a substantially constant distortion in a transmit band and/or a receive band across voltage changes in the envelope signal, and can be calibrated at a particular power level. In one embodiment, the isodistortion table 55 is configured such that the power amplifier's distortion changes by less than about −38 decibels relative to carrier (dBc) for the transmit band and −130 decibel-milliwatt per hertz (dBm/Hz) for the receive band dB over the envelope signal's range.

The isodistortion table 55 can be calibrated for a particular power level (such as an output power level) and for a particular linearity and receive distortion. The isodistortion table 55 can operate optimally for the calibrated output power level but performance can fall off at high average output power as the gain of the power amplifier 32 is compressed to meet compression criteria. To achieve a given output power in these conditions, the I/Q modulator 37 can increase the power of the RF signal provided to the power amplifier 32. However, the I/Q modulator 37 can also work harder when increasing the RF signal's power, and hence can significantly increase the total current of the system. Additionally, when the output power level of the power amplifier system 50 is less than that of the calibrated power level of the isodistortion table 55, the average gain of the power amplifier can be higher than a gain required by the system, which can increase the current required from the battery.

To improve overall PAE, the power amplifier system 50 includes not only the isodistortion table 55, but also the gain adjustment table 65 for increasing the gain of the power amplifier at high power levels to reduce a power/current requirement of the I/Q modulator 64 driving the power amplifier 32. The gain adjustment table 65 can increase or boost the power amplifier's gain for at least a portion of the power levels greater than the calibration power level that the isodistortion table 55 is calibrated at. Additionally, in certain implementations the gain adjustment table 65 can decrease the gain of the power amplifier at power levels less than the calibration power level that the isodistortion table 55 is calibrated at. Although increasing the gain of the power amplifier 32 can decrease the power amplifier's efficiency in isolation, the overall combined efficiency of the power amplifier 32 and the I/Q modulator 37 can be increased.

In the illustrated configuration, the gain of the power amplifier 32 is adjusted by controlling a bias of the bipolar transistor 59 using the power amplifier bias circuit 63. For example, the power amplifier bias circuit 63 can be used to control a base current and/or base voltage of the bipolar transistor 59, thereby controlling the power amplifier's gain. However, other configurations are possible. Additionally, although the power amplifier system 50 is illustrated in the context of a single stage configuration, the teachings herein are applicable to multi-stage configurations in which the gain of one or more of the stages is adjusted using the power amplifier bias circuit 63.

Figure 5:
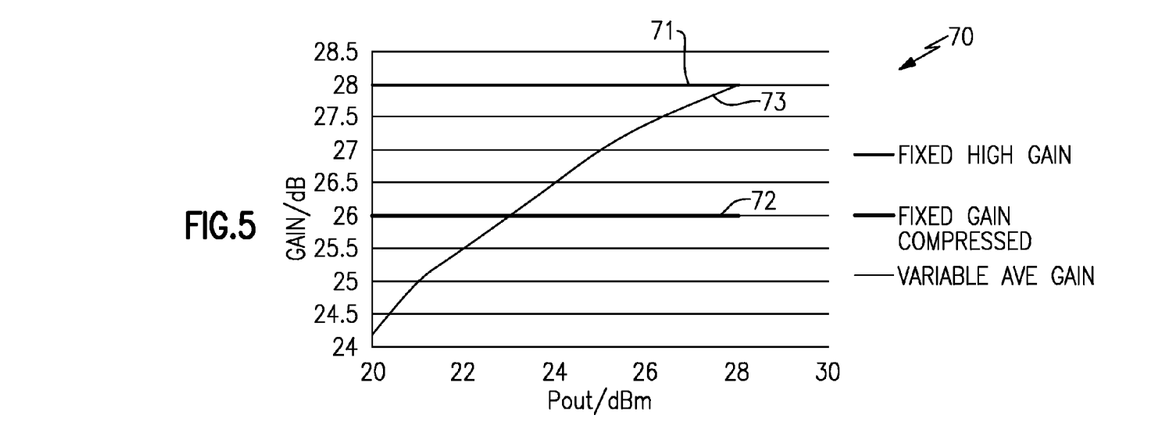
FIG. 5 is one example of a graph showing gain versus output power.

FIG. 5 is one example of a graph 70 showing gain versus output power. The graph 70 includes a first plot 71 of gain versus output power for one example of a fixed high gain power amplifier, a second plot 72 of gain versus output power for one example of a lower fixed compressed gain power amplifier, and a third plot 73 of gain versus output power for one example of a variable average gain power amplifier. The third plot 73 of gain versus output power can correspond to the gain of certain power amplifiers described herein.

Figure 6:
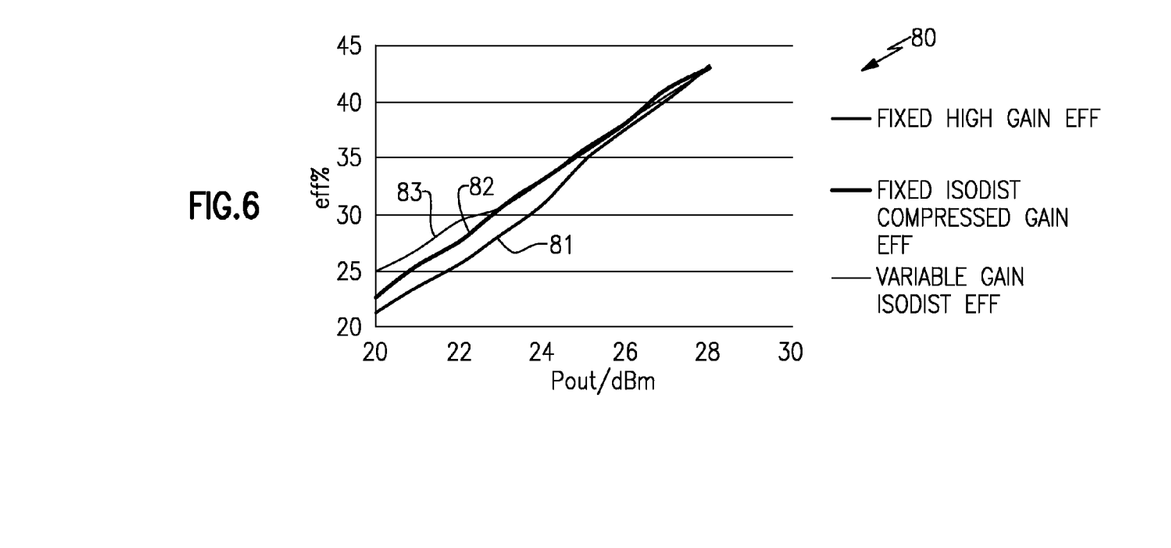
FIG. 6 is one example of a graph showing efficiency versus output power.

FIG. 6 is one example of a graph 80 showing efficiency versus output power for a power amplifier. The graph 80 includes a first plot 81 of efficiency versus output power for a fixed high gain power amplifier, a second plot 82 of efficiency versus output power for a fixed isodistortion compressed gain power amplifier, and a third plot 83 of efficiency versus output power for a variable gain isodistortion power amplifier.

The third plot 83 of efficiency versus output power can correspond to the efficiency of certain power amplifier systems described herein, which can use both an isodistortion table and a gain adjustment table. As shown in FIG. 6, the efficiency of a power amplifier in certain embodiments herein may decrease at high power levels, since the power amplifier can be biased to have increased gain in such conditions. Although the power amplifier's efficiency in isolation may decrease in these conditions, overall combined efficiency (not shown in FIG. 6) of the power amplifier and the I/Q modulator can be increased relative to a power amplifier system using either an isogain table or an isodistortion table without gain adjustment.

Figure 7:
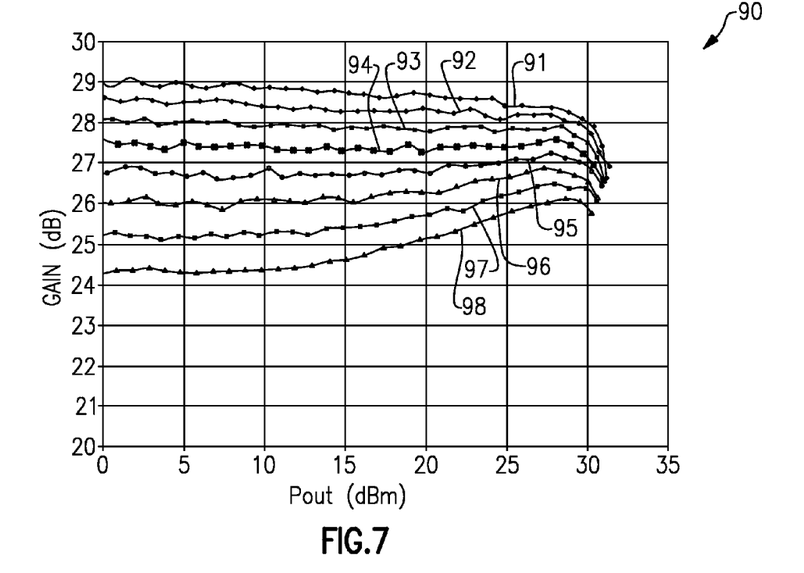
FIG. 7 is one example of a graph showing gain versus output power for different power amplifier bias voltages.

FIG. 7 is one example of a graph 90 showing gain versus output power for different power amplifier bias voltages. The graph 90 includes a plurality of plots corresponding to gain versus output power for different power amplifier bias voltages for one configuration of a power amplifier operating with a power amplifier supply voltage of about 3.4 V. The graph 90 includes a first plot 91 corresponding to a power amplifier bias voltage of about 1.5 V, a second plot 92 corresponding to a power amplifier bias voltage of about 1.4 V, a third plot 93 corresponding to a power amplifier bias voltage of about 1.3 V, a fourth plot 94 corresponding to a power amplifier bias voltage of about 1.2 V, a fifth plot 95 corresponding to a power amplifier bias voltage of about 1.1 V, a sixth plot 96 corresponding to a power amplifier bias voltage of about 1.0 V, a seventh plot 97 corresponding to a power amplifier bias voltage of about 0.9 V, and an eighth plot 98 corresponding to a power amplifier bias voltage of about 0.8 V.

Figure 8:
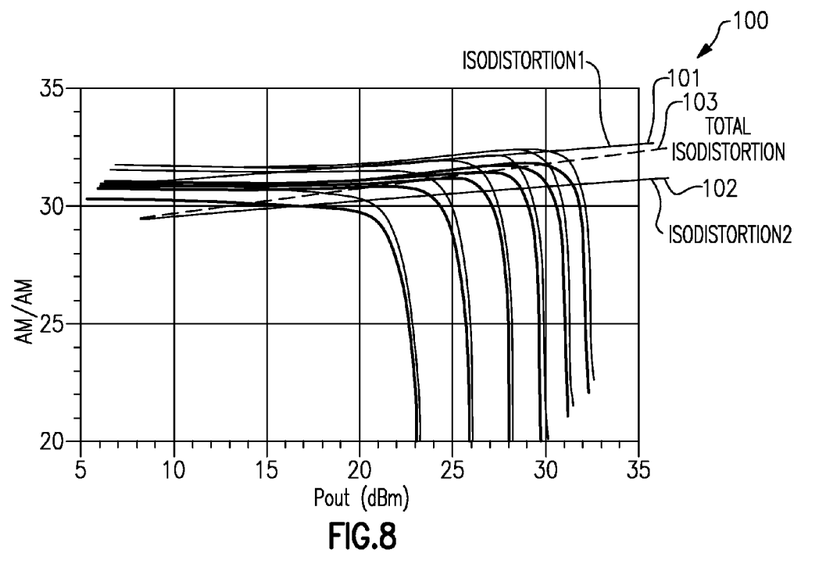
FIG. 8 is one example of a graph showing instantaneous gain (AM/AM) versus output power for different power amplifier bias voltages.

FIG. 8 is one example of a graph 100 showing instantaneous gain (AM/AM) versus output power for different power amplifier bias voltages. The graph 100 includes a plurality of gain versus output power plots, and has been annotated to include a first plot 101 and a second plot 102 corresponding to two different fixed isodistortion values. The graph 100 further includes a total isodistortion plot 103, which can correspond to the gain versus output power in accordance with certain embodiments described herein.

As described earlier, the power amplifier systems herein can include an isodistortion table calibrated at a calibration power level, and a shaping table for changing the gain of the power amplifier based on the power level. The plot 103 of total isodistortion shown in FIG. 8 corresponds to one embodiment of gain versus output power for a power amplifier system including both an isodistortion table and a gain adjustment table.

Although FIGS. 5-8 illustrate various graphs of power amplifier performance characteristics, a power amplifier can be implemented in a variety of ways, such as those suited for a particular application and/or communication standard. Accordingly, the graphs are included for illustrative purposes only, and other simulation and/or measurement results are possible.

Applications

Some of the embodiments described above have provided examples in connection with mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
a modulator configured to generate a radio frequency (RF) signal;
a power amplifier configured to amplify the RF signal to generate an amplified RF signal, the power amplifier configured to receive a power amplifier supply voltage for powering the power amplifier;
an envelope tracker configured to generate the power amplifier supply voltage, the envelope tracker configured to control a voltage level of the power amplifier supply voltage based on a shaped envelope signal;
an envelope shaping circuit configured to generate the shaped envelope signal by shaping an envelope signal corresponding to an envelope of the RF signal, the envelope shaping circuit including a shaping table configured to maintain a substantially constant distortion in at least one of a transmit band or a receive band across voltage changes in the envelope signal, the shaping table calibrated at a first RF power level; and a gain control circuit including a gain adjustment table configured to boost the gain of the power amplifier for one or more output power levels greater than the first RF power level, the gain control circuit configured to enhance a combined power efficiency of the modulator and the power amplifier.

2. The power amplifier system of claim 1 wherein the shaping table is further configured to maintain a substantially constant distortion in both the transmit band and the receive band across voltage changes in the envelope signal.

3. The power amplifier system of claim 1 wherein the gain adjustment table is further configured to decrease the gain of the power amplifier for one or more output power levels less than the first RF power level.

4. The power amplifier system of claim 1 wherein the shaping table is configured to maintain a distortion of the power amplifier system to be less than about −38 dBc for the transmit band and less than about −130 dBm/Hz for the receive band.

5. The power amplifier system of claim 1 wherein the shaping table includes a look-up table configured to receive a digital input signal and to generate a digital output signal, the digital input signal indicating a voltage level of the envelope signal, and the digital output signal indicating a voltage level of the shaped envelope signal.

6. The power amplifier system of claim 5 further comprising a digital-to-analog converter (DAC) configured to convert the digital output signal of the shaping table to generate the shaped envelope signal.

7. The power amplifier system of claim 1 wherein the gain adjustment table includes a look-up table configured to receive a digital input signal and to generate a digital output signal, the digital input signal indicating a voltage level of a power feedback signal, and the digital output signal indicating a voltage level of a power amplifier bias signal.

8. The power amplifier system of claim 7 further comprising a DAC configured to convert the digital output signal of the gain adjustment table to generate an analog bias control signal.

9. The power amplifier system of claim 8 further comprising a power amplifier bias circuit configured to control the gain of the power amplifier using the analog bias control signal.

10. The power amplifier system of claim 9 wherein the power amplifier includes a bipolar transistor, the power amplifier bias circuit configured to control at least one of a base bias current or a base bias voltage of the bipolar transistor.

11. The power amplifier system of claim 7 further comprising a directional coupler configured to sense a power output level of the power amplifier, the power feedback signal based on the power output level sensed by the directional coupler.

12. A mobile device comprising:
a baseband processor configured to generate an in-phase (I) signal, a quadrature-phase (Q) signal, and an envelope signal, the envelope signal indicative of an envelope of the I signal and the Q signal;
an I/Q modulator configured to receive the I signal and the Q signal and to generate a radio frequency (RF) signal;
a power amplifier configured to amplify the RF signal to generate an amplified RF signal, the power amplifier configured to receive a power amplifier supply voltage for powering the power amplifier;
an envelope shaping circuit configured to generate a shaped envelope signal by shaping the envelope signal, the envelope shaping circuit including a shaping table configured to maintain a substantially constant distortion in at least one of a transmit band or a receive band across voltage changes in the envelope signal, the shaping table calibrated at a first RF power level;

an envelope tracker configured to generate the power amplifier supply voltage, the envelope tracker configured to control a voltage level of the power amplifier supply voltage based on a shaped envelope signal; and a gain control circuit including a gain adjustment table configured to boost the gain of the power amplifier for one or more output power levels greater than the first RF power level.

13. The mobile device of claim 12 wherein the shaping table is further configured to maintain a substantially constant distortion in both the transmit band and the receive band across voltage changes in the envelope signal.

14. The mobile device of claim 12 further comprising a battery configured to provide a battery voltage to the envelope tracker.

15. The mobile device of claim 12 further comprising a switch configured to receive the amplified RF signal from the power amplifier and an antenna electrically connected to the switch.

16. The mobile device of claim 12 wherein the gain adjustment table includes a look-up table configured to receive a digital input signal and to generate a digital output signal, the digital input signal indicating a voltage level of a power feedback signal, and the digital output signal indicating a voltage level of a power amplifier bias signal.

17. The mobile device of claim 16 further comprising a directional coupler configured to sense a power output level of the power amplifier, the power feedback signal based on the power output level sensed by the directional coupler.

18. A method of amplification in a power amplifier system, the method comprising:

generating a radio frequency (RF) signal using a modulator;

amplifying the RF signal to generate an amplified RF signal using a power amplifier;

generating a shaped envelope signal by shaping an envelope signal corresponding to an envelope of the RF signal using an envelope shaping circuit, the envelope shaping circuit including a shaping table for mapping a plurality of voltage levels of the envelope signal to a plurality of voltage levels of the shaped envelope signal by maintaining a substantially constant distortion in at least one of a transmit band or a receive band across voltage changes in the envelope signal, the shaping table calibrated at a first RF power level;

generating a power amplifier supply voltage for the power amplifier using an envelope tracker;

controlling a voltage level of the power amplifier supply voltage based on the shaped envelope signal using the envelope tracker; and controlling the gain of the power amplifier using a gain control circuit, the gain control circuit including a gain adjustment table for boosting a gain of the power amplifier for one or more output power levels greater than the first RF power level to enhance a combined power efficiency of the modulator and the power amplifier.

19. The method of claim 18 further comprising using the shaping table to maintain a distortion of the power amplifier system to be less than about −38 dBc for the transmit band and less than about −130 dBm/Hz for the receive band.

20. The method of claim 18 wherein controlling the gain of the power amplifier further includes using the gain adjustment table to decrease the gain of the power amplifier for one or more output power levels less than the first RF power level.

* * * * *